US012578397B2

(12) United States Patent
Feng et al.

(10) Patent No.: US 12,578,397 B2
(45) Date of Patent: Mar. 17, 2026

(54) METHOD, APPARATUS, MEDIUM AND DEVICE FOR DETERMINING VOLTAGE INFLECTION POINT OF CELL CORE IN LFP BATTERY

(71) Applicant: BYD COMPANY LIMITED, Guangdong (CN)

(72) Inventors: Tianyu Feng, Shenzhen (CN); Xiaoqian Li, Shenzhen (CN); Linwang Deng, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 335 days.

(21) Appl. No.: 18/344,556

(22) Filed: Jun. 29, 2023

(65) Prior Publication Data

US 2023/0341472 A1     Oct. 26, 2023

Related U.S. Application Data

(63) Continuation of application No. PCT/CN2022/076692, filed on Feb. 17, 2022.

(30) Foreign Application Priority Data

Mar. 31, 2021     (CN) ......................... 202110351934.X

(51) Int. Cl.
G01R 31/396          (2019.01)
G01R 31/367          (2019.01)
(Continued)

(52) U.S. Cl.
CPC ......... G01R 31/396 (2019.01); G01R 31/367 (2019.01); G01R 31/3842 (2019.01); H02J 7/0048 (2020.01)

(58) Field of Classification Search
CPC ................ G01R 31/396; G01R 31/367; G01R 31/3842; G01R 31/378; G01R 31/382;
(Continued)

(56) References Cited

U.S. PATENT DOCUMENTS

| | | | |
|---|---|---|---|
| 2018/0203071 A1* | 7/2018 | Takemura ............. | H01M 10/48 |
| 2019/0113577 A1* | 4/2019 | Severson ........... | G01R 31/3842 |

(Continued)

FOREIGN PATENT DOCUMENTS

| | | |
|---|---|---|
| CN | 102645636 A | 8/2012 |
| CN | 107561449 A | 1/2018 |

(Continued)

OTHER PUBLICATIONS

English translation of International Search Report from PCT/CN2022/076692 dated Apr. 29, 2022 (2 pages).

*Primary Examiner* — Daniel R Miller
(74) *Attorney, Agent, or Firm* — Calfee, Halter & Griswold LLP

(57)          ABSTRACT

A method for determining a voltage inflection point of a cell core in a LFP battery includes: charging the LFP battery with a first current value and monitoring the State of charge (SOC) of the LFP battery, the first current value being greater than a predetermined threshold of current; if the SOC of the LFP battery is outside a predetermined detection range, charging the LFP battery with the first current value; if the SOC of the LFP battery is within the detection range, charging the LFP battery with a second current value, the second current value being less than the predetermined threshold of current; and detecting the voltage inflection point of various cell cores in the LFP battery according to parameter information of the various cell cores in the LFP battery in the process of charging where the SOC is within the detection range.

9 Claims, 6 Drawing Sheets

(51) Int. Cl.
    *G01R 31/3842*     (2019.01)
    *H02J 7/00*     (2006.01)

(58) Field of Classification Search
    CPC ............ G01R 19/16571; G01R 31/379; G01R
             31/385; G01R 31/392; H02J 7/0048;
          H02J 7/00716; H02J 7/005; Y02E 60/10;
           H01M 4/5825; H01M 10/052; H01M
          10/0525; H01M 10/42; H01M 10/4285;
                  H01M 10/44; H01M 10/48
    See application file for complete search history.

(56)                 References Cited

U.S. PATENT DOCUMENTS

2020/0366115 A1* 11/2020 Kim .................... H01M 10/425
2021/0199723 A1* 7/2021 Kim .................... G01R 31/392

FOREIGN PATENT DOCUMENTS

| | | | | | |
|---|---|---|---|---|---|
| CN | 107835947 | A | 3/2018 | | |
| CN | 109870655 | A | 6/2019 | | |
| CN | 110320477 | A | 10/2019 | | |
| CN | 110323793 | A | 10/2019 | | |
| CN | 110549909 | A | 12/2019 | | |
| CN | 110888065 | A | 3/2020 | | |
| DE | 102013206189 | A1 * | 10/2014 | ........... | H01M 10/48 |
| JP | 5354416 | B1 | 11/2013 | | |
| WO | 2020218826 | A1 | 10/2020 | | |

* cited by examiner

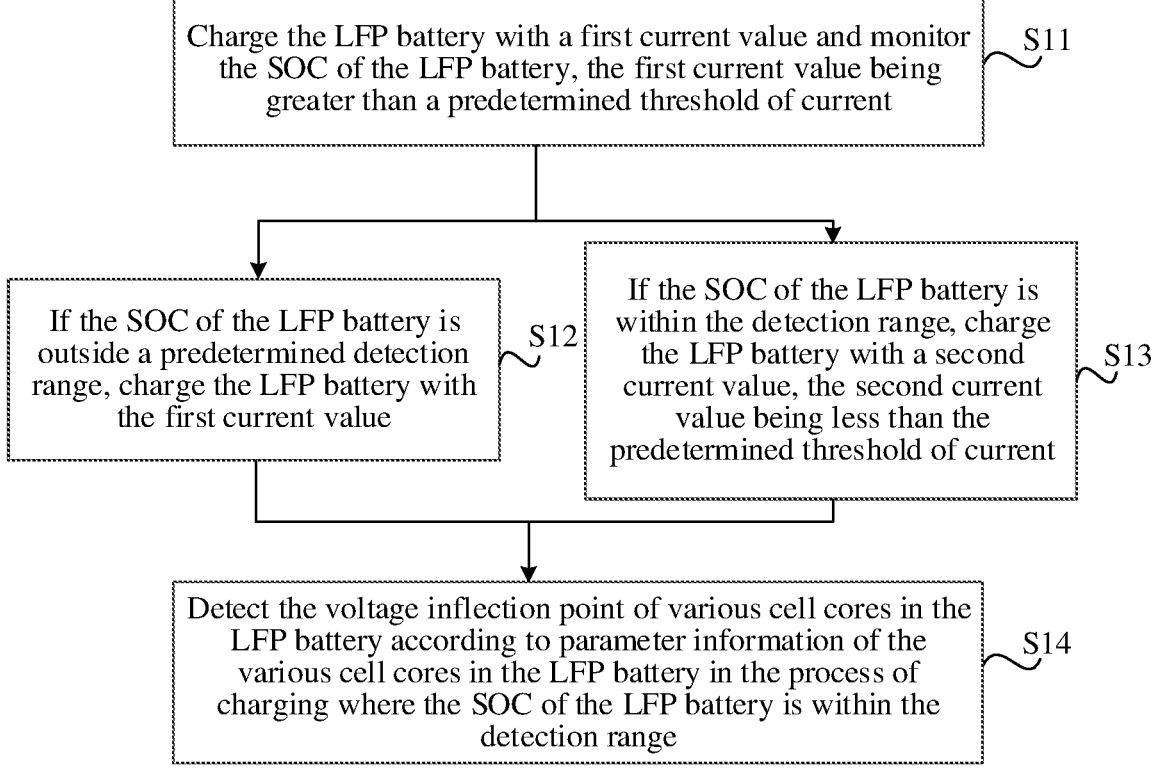

Charge the LFP battery with a first current value and monitor the SOC of the LFP battery, the first current value being greater than a predetermined threshold of current                S11

If the SOC of the LFP battery is outside a predetermined detection range, charge the LFP battery with the first current value                S12

If the SOC of the LFP battery is within the detection range, charge the LFP battery with a second current value, the second current value being less than the predetermined threshold of current                S13

Detect the voltage inflection point of various cell cores in the LFP battery according to parameter information of the various cell cores in the LFP battery in the process of charging where the SOC of the LFP battery is within the detection range                S14

FIG. 3

METHOD, APPARATUS, MEDIUM AND DEVICE FOR DETERMINING VOLTAGE INFLECTION POINT OF CELL CORE IN LFP BATTERY

CROSS-REFERENCE TO RELATED APPLICATION

The present disclosure is a bypass continuation application for PCT International Application Number PCT/CN2022/076692, filed on Feb. 17, 2022, which claims priority to Chinese Patent Application 202110351934.X filed on Mar. 31, 2021, and entitled "METHOD, APPARATUS, MEDIUM AND DEVICE FOR DETERMINING VOLTAGE INFLECTION POINT OF CELL CORE IN LFP BATTERY", which are incorporated herein by reference in their entireties.

FIELD

The present disclosure relates to the technical field of automatic control in a power battery, and particularly to a method, apparatus, medium and device for determining a voltage inflection point of a cell core in a LFP battery.

BACKGROUND

The voltage inflection point in a lithium-ion battery is the phenomenon of an inflection point in the voltage-charge characteristics curve during charging and discharging. This phenomenon is caused by the electrochemical properties of the battery itself, and the characteristics of the inflection point are affected by factors such as the battery temperature, State of health (SOH), and charge and discharge current or the like of the battery. The voltage inflection point of a lithium-ion battery has wide applications in estimation of State of health (SOH) of a power battery, calculation of the target equalized charge of a battery module or the like.

In the AC pile low current charging mode, the voltage differential curve presents apparent characteristic peaks, which enables easy detection of the voltage inflection point. As the current increases, the characteristic peaks gradually disappear. In the high current fast charging mode, however, it is difficult to detect the voltage inflection point of the battery, and application of the above functions based on the voltage inflection point cannot be achieved. For example, for an operating vehicle adopting the fast charging mode for charging for a prolonged time period, this causes problems of incapability of timely update of the SOH of the battery, prolonged incapability of enabling battery equalization or the like.

SUMMARY

It is an objective of the present disclosure to provide a method, apparatus, medium and device for determining a voltage inflection point of a cell core in a LFP battery that can identify the voltage inflection point during charging.

In order to achieve the above objective, the present disclosure provides a method for determining a voltage inflection point of a cell core in a LFP battery, including:

charging the LFP battery with a first current value and monitoring the State of charge (SOC) of the LFP battery, the first current value being greater than a predetermined threshold of current;

if the SOC of the LFP battery is outside a predetermined detection range, the LFP battery is charged with the first current value;

if the SOC of the LFP battery is within the detection range, the LFP battery is charged with a second current value, the second current value being less than the predetermined threshold of current; and detecting the voltage inflection point of various cell cores in the LFP battery according to parameter information of the various cell cores in the LFP battery in the process of charging where the SOC of the LFP battery is within the detection range.

In some embodiments, before charging the LFP battery with the first current value and monitoring the State of charge (SOC) of the LFP battery, the method further includes:

detecting the voltage inflection point of various cell cores in the LFP battery while charging the LFP battery with the second current value;

determining the SOC of the LFP battery according to the voltage inflection point of the various cell cores; and determining the detection range according to the SOC of the LFP battery.

In some embodiments, the determining the detection range according to the SOC of the LFP battery includes:

determining the detection range by $$Q=[SOC_0-W,SOC_0+W]$$

where $SOC_0$ is the SOC of the LFP battery determined according to the voltage inflection point of the various cell cores during charging of the LFP battery with the second current value, Q is the detection range and W is a predetermined constant, and $0<W<1$.

In some embodiments, after detecting the voltage inflection point of various cell cores in the LFP battery according to parameter information of the various cell cores in the LFP battery in the process of charging where the SOC of the LFP battery is within the detection range, the method further includes:

updating the detection range according to the detected voltage inflection point of the various cell cores.

In some embodiments, the updating the detection range according to the detected voltage inflection point of the various cell cores includes:

if the voltage inflection point of the cell cores in the LFP battery has been detected, determining the SOC of the LFP battery according to the voltage inflection point of the various cell cores; and updating the detection range according to the determined SOC of the LFP battery.

In some embodiments, the updating the detection range according to the determined SOC of the LFP battery includes:

updating the detection range by $$Q_1=[SOC_1-P,SOC_1+P]$$

where $SOC_1$ is the SOC of the LFP battery determined according to the detected voltage inflection point of the various cell cores in the present charging, $Q_1$ is the detection range updated after the present charging, and P is a predetermined constant, and $0<P<1$.

In some embodiments, the updating the detection range according to the detected voltage inflection point of the various cell cores includes:

if it is detected that no voltage inflection point has been detected for any of the cell cores in the LFP battery, updating the detection range to:

$$Q_2=[M-N+m]$$

where $Q_2$ is the detection range updated after the present charging, m is a predetermined constant, and 0<m<1, and M, N are respectively a lower limit and an upper limit of the detection range applied for the present charging.

The present disclosure further provides a computer-readable storage medium having a computer program stored thereon which, when executed by a processor, implements the steps of the above method provided by the present disclosure.

The present disclosure further provides an electronic device, including:

a memory having a computer program stored thereon; and a processor configured to execute the computer program in the memory to implement the steps of the above method provided by the present disclosure.

Other features and advantages of the present disclosure will be described in detail in the following detailed description.

BRIEF DESCRIPTION OF THE DRAWINGS

The accompanying drawings are intended to provide further understanding of the present disclosure and constitute part of this specification. The accompanying drawings and the specific implementations below are used together for explaining the present disclosure rather than constituting limitation to the present disclosure. In the accompanying drawings:

FIG. 3 is a flow chart of a method for determining a voltage inflection point of a cell core in a LFP battery according to an exemplary embodiment;

DETAILED DESCRIPTION

Specific implementations of the present disclosure are described in detail below with reference to the accompanying drawings. It should be understood that the specific implementations described herein are merely used to describe and explain the present disclosure and are not intended to limit the present disclosure.

Figure 1:
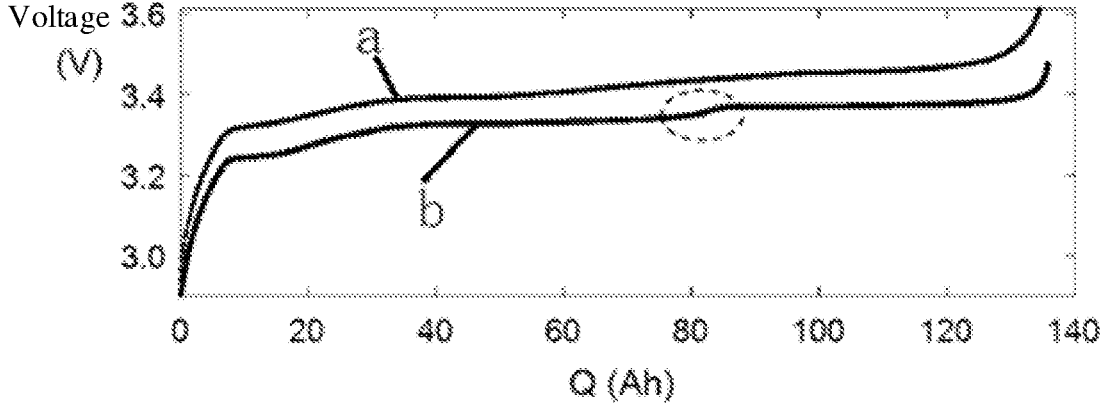
FIG. 1 is a schematic graph showing that the charging voltage varies with the charged capacity of a lithium-ion battery during charging of the battery.

FIG. 1 is a schematic graph showing that the charging voltage varies with the charged capacity of a lithium-ion battery during charging of the battery. In FIG. 1, the horizontal axis represents the charged capacity of the battery in Ah and the vertical axis represents the charging voltage in V. FIG. 1 shows the curve a for the charging current of 0.5C and the curve b for the charging current of 0.1C.

Figure 2:
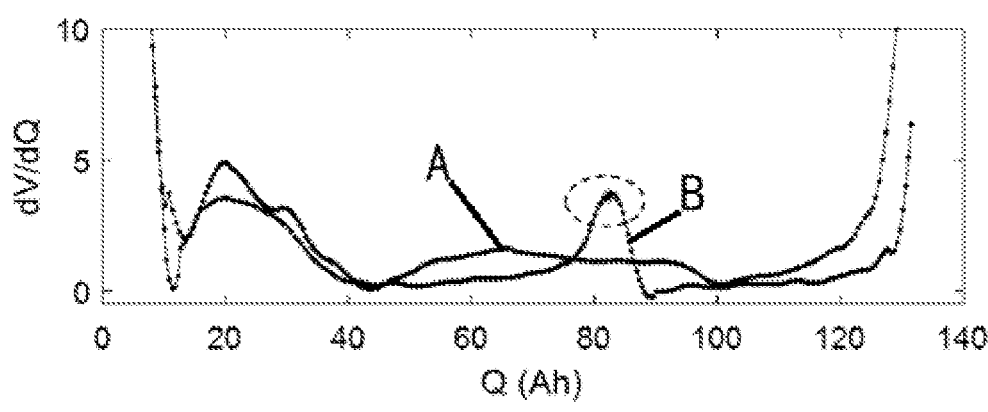
FIG. 2 is a schematic graph showing the voltage differential curve during charging of a lithium-ion battery.

FIG. 2 is a schematic graph showing the voltage differential curve during charging of a lithium-ion battery. In FIG.

2, the horizontal axis represents the charged capacity of the battery and the vertical axis represents the voltage differential (dV/dQ). FIG. 2 shows the curve A for the charging current of 0.5C and the curve B for the charging current of 0.1C. In this figure, the dotted circle in the curve b corresponds to the dotted circle in the curve B and represents the voltage inflection point of this lithium battery, which is at about 80 Ah. It can be seen that the curve B for the low charging current has an apparent voltage inflection point, whereas the curve A for the high charging current has no voltage inflection point. It can be seen that in the high current fast charging mode, it is difficult to detect the voltage inflection point of the lithium-ion battery.

FIG. 3 is a flow chart of a method for determining a voltage inflection point of a cell core in a LFP battery according to an exemplary embodiment. As shown in FIG. 3, the method may include the following steps.

Step S11: the LiFePO$_4$ (LFP) battery is charged with a first current value and the State of charge (SOC) of the LFP battery is monitored. The first current value is greater than a predetermined threshold of current.

Step S12: if the SOC of the LFP battery is outside a predetermined detection range, the LFP battery is charged with the first current value.

Step S13: if the SOC of the LFP battery is within the detection range, the LFP battery is charged with the second current value. The second current value is less than the predetermined threshold of current.

Step S14: the voltage inflection point of various cell cores in the LFP battery is detected according to parameter information of the various cell cores in the LFP battery in the process of charging where the SOC of the LFP battery is within the detection range.

The present disclosure is applicable to a LFP battery. During charging, the current and voltage of the battery can be detected in real time and the SOC of the LFP battery can be calculated. The method for determining SOC is well known to those skilled in the art and thus shall not be detailed herein.

The detection range may be determined in advance. Specifically, the voltage inflection point of various cell cores in the LFP battery may be detected before the end of the production line of the vehicle and the SOC of the battery is determined according to the voltage inflection point of the various cell cores. An upper limit and a lower limit for the detection range are set near the SOC of this battery, and the determined detection range is stored.

The first current value may represent, for example, a charging current obtained according to the MAP table of the charging strategy for this fast charging mode. The LFP battery is charged with the first current value, i.e., the LFP battery is normally charged in the fast charging mode. When the charging current has the second current value, an apparent voltage inflection point can be detected. The second current value may be a charging current value, causing the charging voltage to have an apparent inflection point. In the process of charging where the SOC of the battery is within the detection range, the voltage inflection point of each cell core is detected according to the parameter information of this cell core respectively. The method for detecting the voltage inflection point is well known to those skilled in the art and thus shall not be detailed herein.

That is, in the present solution, in the process of charging the LFP battery with a high current (of the first current value), in some SOC ranges (detection range) a low charging current (of the second current value) is used and the voltage inflection point of the cell cores is detected, and in other SOC ranges, the charging strategy of original high current (of the first current value) charging is maintained. The present solution may be performed by a Battery Management System (BMS).

With the technical solution described above, while the LFP battery is being charged with a high current, the charging current is regulated within a predetermined detection range in such a manner that it is controlled in a targeted manner so that charging is done with a low current to detect the voltage inflection point of the cell cores within this detection range and so that charging is done according to the original high current strategy in the remaining range. In this way, it is possible to detect the voltage inflection point of the cell cores in the case of the original high current charging, so that the SOH of the LFP battery can be updated in time and the battery can be equalized in time.

Figure 4:
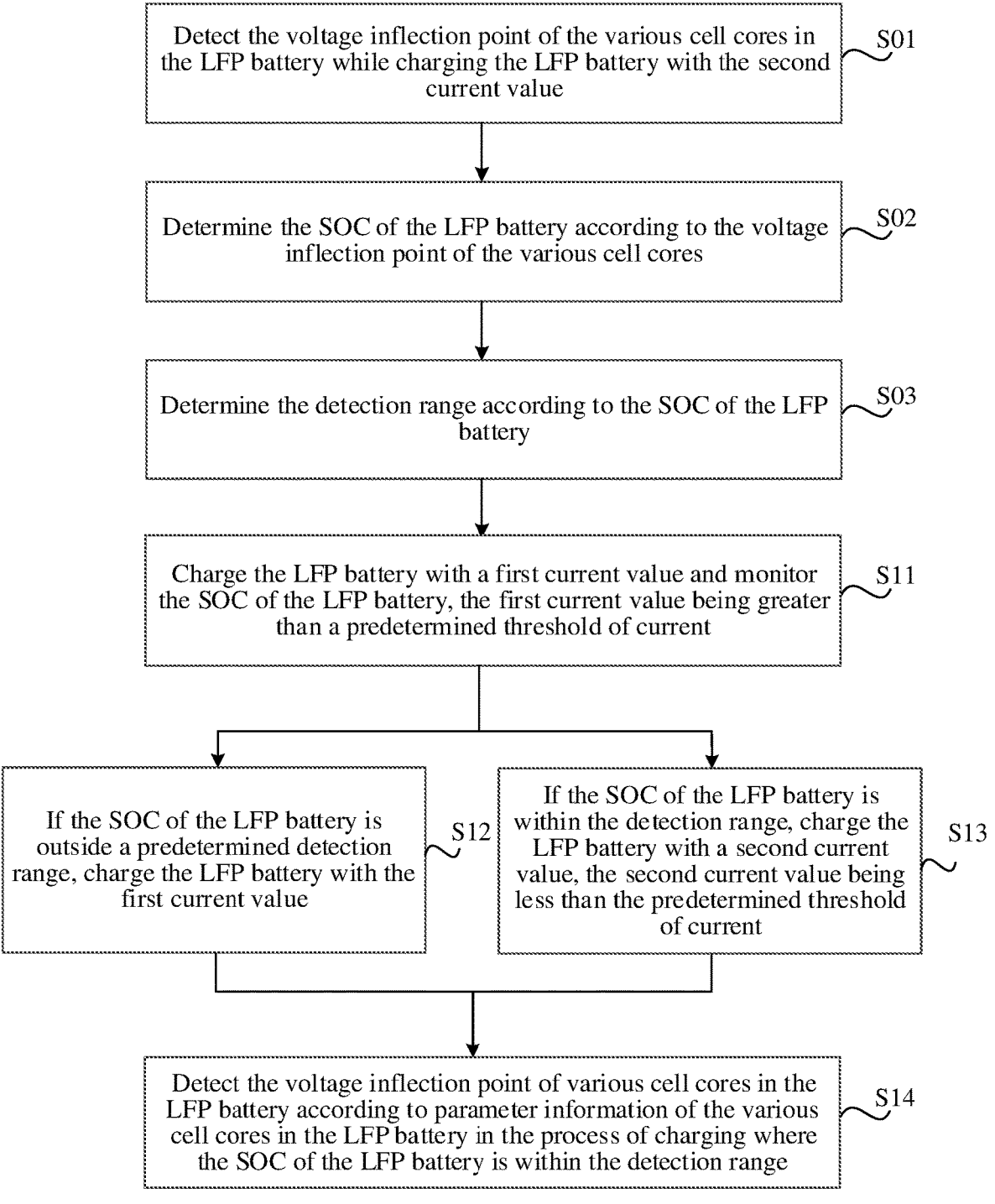
FIG. 4 is a flow chart of a method for determining a voltage inflection point of a cell core in a LFP battery according to another exemplary embodiment.

FIG. 4 is a flow chart of a method for determining a voltage inflection point of a cell core in a LFP battery according to another exemplary embodiment. As shown in FIG. 4, on the basis of FIG. 3, before the step of charging the LFP battery with the first current value and monitoring the SOC of the LFP battery (Step S11), this method may further include the following steps.

Step S01: while charging the LFP battery with the second current value, the voltage inflection point of various cell cores in the LFP battery is detected.

Step S02: the SOC of the LFP battery is determined according to the voltage inflection point of the various cell cores.

Specifically, the SOC of the LFP battery may be determined at one time according to the voltage inflection point of each cell core, and then the final SOC of the LFP battery is determined according to the SOCs of the LFP battery determined at multiple times (for example, by averaging them).

Step S03: the detection range is determined according to the SOC of the LFP battery.

As a voltage inflection point can be detected during low current charging, in this embodiment, an off-line low current charging test can be performed on a power battery sample before the end of the production line of the vehicle to determine the SOC of the battery at the time when the voltage inflection point occurs, and a detection range is determined according to this SOC. The detection range determined in this way is relatively accurate. Therefore, it is very easy to detect the voltage inflection point of the cell core with the method of FIG. 3 during high current charging of the real vehicle.

In yet another embodiment, on the basis of FIG. 4, the step of determining a detection range according to the SOC of the LFP battery (Step S03) may include:
determining the detection range by $$Q=[SOC_0-W,SOC_0+W] \tag{1}$$

where $SOC_0$ is the SOC of the LFP battery determined according to the voltage inflection point of the various cell cores during charging of the LFP battery with the second current value, Q is the detection range and W is a predetermined constant, and 0<W<1.

That is, the SOC of the battery as determined according to the voltage inflection point of the cell cores detected in the slow charging mode (charging with the second current value) is extended upward and downward respectively by W to obtain the detection range. As such, the SOC of the battery as determined according to the voltage inflection point detected in the slow charging mode lies at the midpoint of the detection range, which provides reasonable setting of the detection range, so that it is easy to detect the voltage inflection point with the method of FIG. 3 during high current charging of the real vehicle.

In yet another embodiment, on the basis of FIG. 3, after detecting the voltage inflection point of various cell cores in the LFP battery according to parameter information of the various cell cores in the LFP battery in the process of charging where the SOC of the LFP battery is within the detection range (Step S14), the method may further include: updating the detection range according to the detected voltage inflection point of the various cell cores.

The voltage inflection point detected in the present charging is the up-to-date characteristic value of the various cell cores that characterizes the up-to-date state of the various cell cores. Therefore, based on this, the detection range can be updated and the detection range can be dynamically adjusted so that in the next high current charging, detection of the voltage inflection point can be more reliable. Therefore, the voltage inflection point of the cell cores can be detected in real time despite gradual aging of the battery.

In an embodiment, the updating the detection range according to the detected voltage inflection point of the various cell cores may include the following steps. If the voltage inflection point of the cell cores in the LFP battery has been detected, the SOC of the LFP battery is determined according to the voltage inflection point of the various cell cores. The detection range is updated according to the determined SOC of the LFP battery.

The SOC of the LFP battery may be determined at one time according to the voltage inflection point of each cell core, and then the final SOC of the LFP battery is determined according to the SOCs of the LFP battery determined at multiple times. Then an updated detection range is determined according to the SOC of the LFP battery. As the detection range is updated on the basis of the up-to-date SOC of the LFP battery, detection of the voltage inflection point is more reliable during the next high current charging.

Specifically, in updating the detection range according to the SOC corresponding to the voltage inflection point, the range containing this SOC can be taken as the updated detection range. For example, the value of the upper limit of the updated detection range may be this SOC plus the predetermined constant a, the value of the lower limit of the updated detection range may be this SOC minus the constant b, and the constant a may not be equal to the constant b, and 0<a<1 and 0<b<1.

In yet another embodiment, the updating the detection range according to the determined SOC of the LFP battery may include:
updating the detection range by $$Q_1=[SOC_1-P,SOC_1+P] \tag{2}$$

where $SOC_1$ is the SOC of the LFP battery determined according to the detected voltage inflection point of the various cell cores in the present charging, $Q_1$ is the detection range updated after the present charging, and P is a predetermined constant, and 0<P<1.

The conception of the formula (2) is similar to that of the formula (1). That is, the SOC of the battery as determined according to the voltage inflection point detected in the present charging is extended upward and downward respectively by P to obtain the detection range updated after the present charging. As such, the SOC of the battery as determined according to the voltage inflection point of the cell core detected in the present charging lies at the midpoint of the detection range, which provides reasonable setting of the detection range, so that it is easy to detect the voltage inflection point with the method of FIG. 3 during high current charging of the real vehicle.

There may be cases where no voltage inflection point has been detected for a cell core, which means that the voltage inflection point cannot be detected for this cell core in the current detection range. Therefore, the detection range needs to be extended.

In yet another embodiment, the updating the detection range according to the detected voltage inflection point of the various cell cores may further include: if it is detected that no voltage inflection point has been detected for a cell core in the LFP battery, updating the detection range to:

$$Q_2=[M-m, N+m] \tag{3}$$

where $Q_2$ is the detection range updated after the present charging, m is a predetermined constant, and 0<m<1, and M, N are respectively a lower limit and an upper limit of the detection range applied for the present charging.

That is, if no voltage inflection point has been detected for a cell core, the detection range applied for the present charging is extended upward and downward by the same width, so that in the next charging, it is possible to detect a voltage inflection point for the cell cores.

Figure 5:
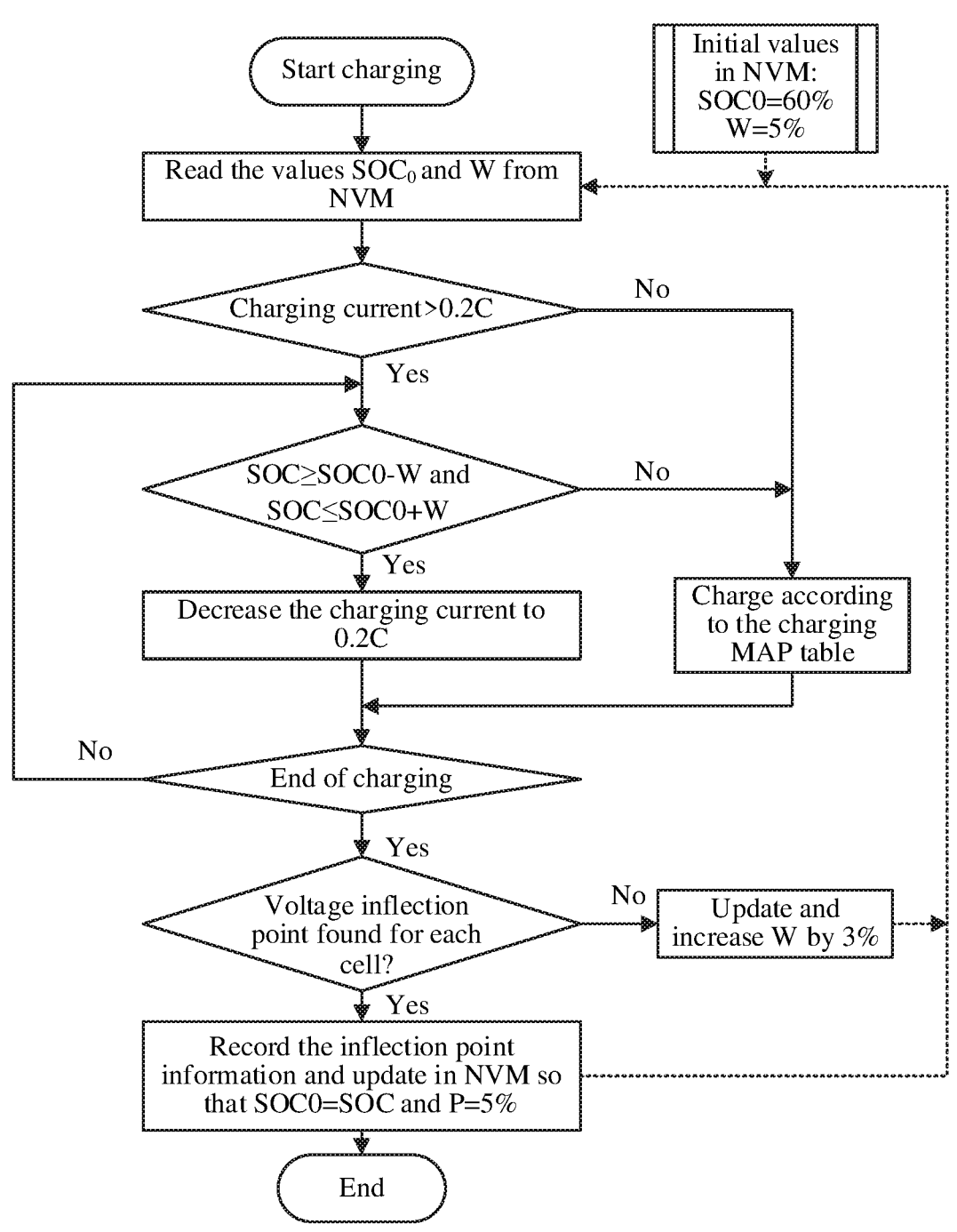
FIG. 5 is a flow chart of a method for determining a voltage inflection point of a cell core in a LFP battery according to yet another exemplary embodiment.

FIG. 5 is a flow chart of a method for determining a voltage inflection point of a cell core in a LFP battery according to yet another exemplary embodiment. In the embodiment of FIG. 5, the method for controlling charging of a LFP battery may include the following steps.

1: The values $SOC_0$ and W pre-stored in the Non-Volatile Memory (NVM) are read to determine the detection range. As for the initial values of the detection range, $SOC_0$=60% and W=5%.

2: If the charging current is less than 0.2C (slow charging), charging is done according to the MAP table for slow charging.

3: If the charging current is greater than 0.2C (fast charging) and the measured $SOC \geq SOC_0-W$ and the measured $SOC \leq SOC_0+W$, the charging current is decreased to 0.2C.

4: If the charging current is greater than 0.2C and the measured $SOC \leq SOC_0-W$, or the measured $SOC \leq SOC_0+W$, charging is done according to the MAP table for fast charging.

5: After charging is finished, if the voltage inflection point has been detected for the cell cores, the inflection point information is recorded and the detection range in NVM is updated so that $SOC_0$=the measured SOC and P=5%.

6: After charging is finished, if no voltage inflection point has been detected for a cell core, the detection range in NVM is updated so that W is increased by 3%, i.e., m=3%.

Figure 6:
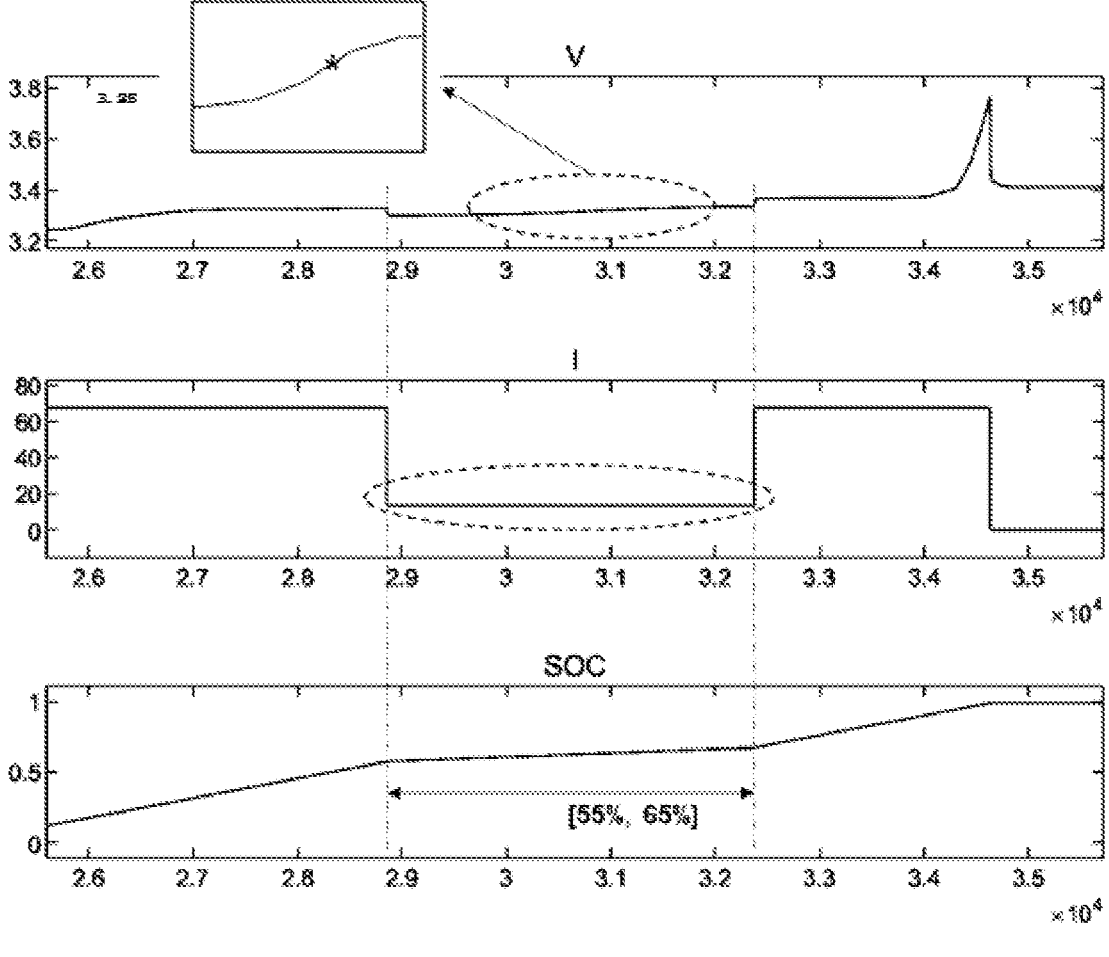
FIG. 6 is a schematic view showing charging current regulation for a LFP battery according to an exemplary embodiment.

FIG. 6 is a schematic view showing charging current regulation for a LFP battery according to an exemplary embodiment. As shown in FIG. 6, the horizontal axis represents the charging duration. In the SOC curve, the current is regulated in 55%-65% of the range (detection range) and corresponds to a low charging current in the current curve, and corresponds to the segment of voltage curve in the corresponding time period. In an enlarged view of this segment of voltage curve, the point represented by an asterisk is the voltage inflection point, which is an apparent inflection point in the voltage differential curve.

Figure 7:
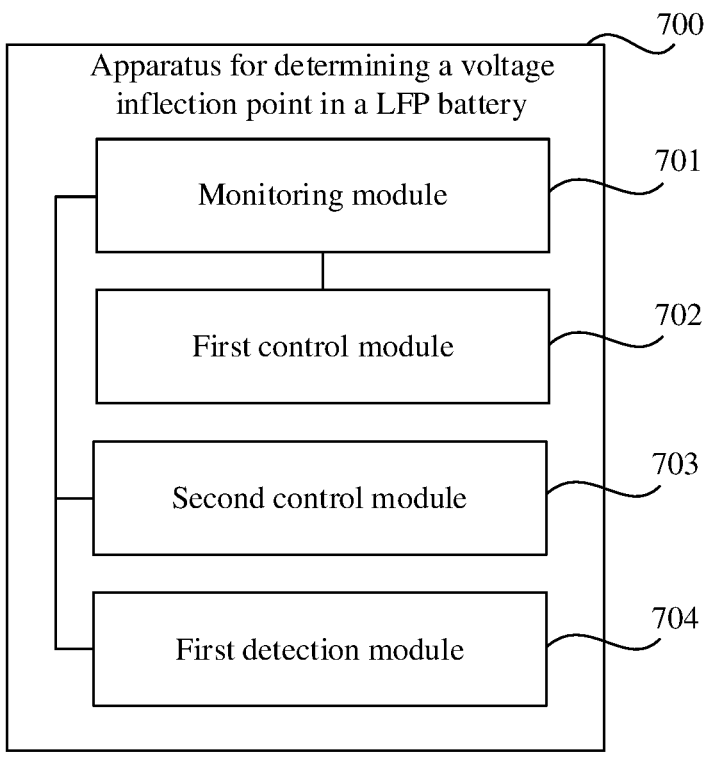
FIG. 7 is a block diagram of an apparatus for determining a voltage inflection point of a cell core in a LFP battery according to an exemplary embodiment.

FIG. 7 is a block diagram of an apparatus for determining a voltage inflection point of a cell core in a LFP battery according to an exemplary embodiment. As shown in FIG. 7, the apparatus 700 for determining a voltage inflection point of a cell core in a LFP battery may include a monitoring module 701, a first control module 702, a second control module 703 and a first detection module 704.

The monitoring module 701 is configured to charge the LFP battery with a first current value and monitor the State of charge (SOC) of the LFP battery. The first current value is greater than a predetermined threshold of current.

The first control module 702 is configured to charge the LFP battery with the first current value if the SOC of the LFP battery is outside the predetermined detection range.

The second control module 703 is configured to charge the LFP battery with the second current value if the SOC of the LFP battery is within the detection range. The second current value is less than the predetermined threshold of current.

The first detection module 704 is configured to detect the voltage inflection point of various cell cores in the LFP battery according to parameter information of the various cell cores in the LFP battery in the process of charging where the SOC of the LFP battery is within the detection range.

In some embodiments, the apparatus 700 may further include a second detection module, a first determination module and a second determination module.

The second detection module is configured to detect the voltage inflection point of various cell cores in the LFP battery while charging the LFP battery with the second current value.

The first determination module is configured to determine the SOC of the LFP battery according to the voltage inflection point of various cell cores.

The second determination module is configured to determine the detection range according to the SOC of the LFP battery.

In some embodiments, in the second determination module, the detection range is determined by $$Q=[SOC_0-W, SOC_0+W]$$

where $SOC_0$ is the SOC of the LFP battery determined according to the voltage inflection point of the various cell cores during charging of the LFP battery with the second current value, Q is the detection range and W is a predetermined constant, and 0<W<1.

In some embodiments, the apparatus 700 may further include an update module.

The update module is configured to update the detection range according to the detected voltage inflection point of the various cell cores.

In some embodiments, the update module includes a determination submodule and a first update submodule.

The determination submodule is configured to determine the SOC of the LFP battery according to the voltage inflection point of various cell cores if the voltage inflection point of the cell cores in the LFP battery has been detected.

The first update submodule is configured to update the detection range according to the determined SOC of the LFP battery.

In some embodiments, in the first update submodule, the detection range is updated by $$Q_1=[SOC_1-P, SOC_1+P]$$

where $SOC_1$ is the SOC of the LFP battery determined according to the detected voltage inflection point of the various cell cores in the present charging, $Q_1$ is the detection range updated after the present charging, and P is a predetermined constant, and 0<P<1.

In some embodiments, the update module may include a second update submodule.

The second update submodule is configured to, if no voltage inflection point has been detected for a cell core in the LFP battery, update the detection range to $$Q_2[M-m,N+m]$$

where $Q_2$ is the detection range updated after the present charging, m is a predetermined constant, and $0 < m < 1$ and M, N are respectively a lower limit and an upper limit of the detection range applied for the present charging.

For the apparatus in the foregoing embodiments, a specific manner in which each module performs an operation has already been described in detail in the embodiments related to the method, and detailed description thereof shall not be made again herein.

With the technical solution described above, while the LFP battery is being charged with a high current, the charging current can be regulated within a predetermined detection range in such a manner that it is controlled in a targeted manner so that charging is done with a low current to detect the voltage inflection point of the cell cores within this detection range and so that charging is done according to the original high current strategy in the remaining range. In this way, it is possible to detect the voltage inflection point of the cell cores in the case of original high current charging, so that the SOH of the LFP battery can be updated in time and the battery can be equalized in time.

The present disclosure further provides a computer-readable storage medium having a computer program stored thereon which, when executed by a processor, implements the steps of the above method provided by the present disclosure.

The present disclosure further provides an electronic device which includes a memory and a processor. The memory has a computer program stored thereon. The processor is configured to execute the computer program in the memory to implement the steps of the above method provided by the present disclosure.

The present disclosure further provides a vehicle. The vehicle includes a LFP battery and an apparatus 700 for determining a voltage inflection point of a cell core in a LFP battery described above that is provided by the present disclosure.

The preferred implementations of the present disclosure have been described in detail above with reference to the accompanying drawings. However, the present disclosure is not limited to the specific details in the foregoing implementations, several simple variations may be made to the technical solution of the present disclosure within the scope of the technical conception of the present disclosure, and these simple variations fall within the protection scope of the present disclosure.

It should be further noted that, the specific technical features described in the foregoing specific implementations may be combined in any proper manner without conflict. To avoid unnecessary repetition, various possible combination manners are not described in the present disclosure.

In addition, different implementations of the present disclosure may also be arbitrarily combined without departing from the idea of the present disclosure, and these combinations shall still be regarded as content disclosed in the present disclosure.

What is claimed is:

1. A method for determining voltage inflection points of cell cores in a LFP battery, comprising:

charging the LFP battery with a first current value and monitoring a State of charge (SOC) of the LFP battery, the first current value being greater than a predetermined threshold of current;

charging the LFP battery with the first current value while the SOC of the LFP battery is outside a predetermined detection range;

charging the LFP battery with a second current value while the SOC of the LFP battery is within the predetermined detection range, the second current value being less than the predetermined threshold of current; and detecting the voltage inflection points of the cell cores in the LFP battery according to parameter information of the cell cores in the LFP battery in the process of charging where the SOC of the LFP battery is within the predetermined detection range;

before charging the LFP battery with the first current value and monitoring the State of charge (SOC) of the LFP battery, the method further comprises:

detecting the voltage inflection points of the cell cores in the LFP battery while charging the LFP battery with the second current value;

determining the SOC of the LFP battery according to the voltage inflection points of the cell cores; and determining the detection range according to the SOC of the LFP battery;

wherein the determining the detection range according to the SOC of the LFP battery comprises:

determining the detection range by $$Q=[SOC_0-W,SOC_0+W]$$

where $SOC_0$ is the SOC of the LFP battery determined according to the voltage inflection points of the cell cores during charging of the LFP battery with the second current value, Q is on range and W is a predetermined constant, and $0 < W < 1$.

2. The method according to claim 1, after detecting the voltage inflection points of the cell cores in the LFP battery according to parameter information of the cell cores in the LFP battery in the process of charging where the SOC of the LFP battery is within the detection range, the method further comprising:

updating the detection range according to the detected voltage inflection points of the cell cores.

3. The method according to claim 2, wherein the updating the detection range according to the detected voltage inflection points of the cell cores comprises:

if the voltage inflection points of the cell cores in the LFP battery have been detected, determining the SOC of the LFP battery according to the voltage inflection points of the cell cores; and updating the detection range according to the determined SOC of the LFP battery.

4. The method according to claim 3, wherein the updating the detection range according to the detected voltage inflection points of the cell cores comprises:

if it is detected that no voltage inflection point has been detected for any of the cell cores in the LFP battery, updating the detection range to:

$$Q_2=[M-m,N+m]$$

$Q_2$ is the detection range updated after the present charging, m is a predetermined Instant, and $0 < m < 1$, and M, N are respectively a lower limit and an upper limit of the detection range applied for the present charging.

5. The method according to claim 1, wherein the updating the detection range according to the determined SOC of the LFP battery comprises:

updating the detection range by $$Q_1 = [SOC_1 - P, SOC_1 + P]$$

where $SOC_1$ is the SOC of the LFP battery determined according to the detected voltage inflection points of the cell cores in the present charging, $Q_1$ is the detection range updated after the present charging, and P is a predetermined constant, and $0 < P < 1$.

6. The method according to claim 5, wherein the updating the detection range according to the detected voltage inflection points of the cell cores comprises:

if it is detected that no voltage inflection point has been detected for any of the cell cores in the LFP battery, updating the detection range to:

$$Q_2 = [M - m, N + m]$$

where $Q_2$ is the detection range updated after the present charging, m is a predetermined constant, and $0 < m < 1$, and M, N are respectively a lower limit and an upper limit of the detection range applied for the present charging.

7. The method according to claim 2, wherein the updating the detection range according to the detected voltage inflection points of the cell cores comprises:

if it is detected that no voltage inflection point has been detected for any of the cell cores in the LFP battery, updating the detection range to:

$$Q_2 = [M - m, N + m]$$

where $Q_2$ is the detection range updated after the present charging, m is a predetermined constant, and $0 < m < 1$, and M, N are respectively a lower limit and an upper limit of the detection range applied for the present charging.

8. A non-transitory computer-readable storage medium having a computer program stored thereon, wherein the program, when executed by a processor, implements the method according to claim 1.

9. An electronic device, comprising:

a memory having a computer program stored thereon; and a processor configured to execute the computer program in the memory to implement the method according to claim 1.

\* \* \* \* \*